(12) United States Patent
Lu et al.

(10) Patent No.: US 9,806,010 B2
(45) Date of Patent: Oct. 31, 2017

(54) PACKAGE MODULE AND METHOD OF FABRICATING THE SAME

(71) Applicant: Delta Electronics (Shanghai) Co., Ltd., Shanghai (CN)

(72) Inventors: Kai Lu, Shanghai (CN); Zhen-Qing Zhao, Shanghai (CN); Tao Wang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/068,658

(22) Filed: Mar. 14, 2016

(65) Prior Publication Data

US 2016/0365306 A1 Dec. 15, 2016

(30) Foreign Application Priority Data

Jun. 11, 2015 (CN) .......................... 2015 1 0319405

(51) Int. Cl.
*H01L 23/498* (2006.01)
*H01L 25/00* (2006.01)
*H01L 21/48* (2006.01)
*H01L 23/00* (2006.01)
*H01L 25/065* (2006.01)
(Continued)

(52) U.S. Cl.
CPC .... *H01L 23/49811* (2013.01); *H01L 21/4853* (2013.01); *H01L 23/49531* (2013.01); *H01L 23/49548* (2013.01); *H01L 23/49551* (2013.01); *H01L 24/85* (2013.01); *H01L 25/0655* (2013.01); *H01L 25/105* (2013.01); *H01L 25/50* (2013.01); *H01L 23/3121* (2013.01); *H01L 23/49575* (2013.01); *H01L 2224/48227* (2013.01)

(58) Field of Classification Search
CPC ........... H01L 23/49811; H01L 25/0655; H01L 21/4853; H01L 23/053; H01L 25/105; H01L 25/50; H01L 21/565; H01L 21/4817; H01L 24/85; H01L 2224/48227
See application file for complete search history.

(56) References Cited

U.S. PATENT DOCUMENTS 4,394,530 A * 7/1983 Kaufman ................ H01L 23/15
174/16.3
7,851,829 B2 12/2010 Theuss
(Continued)

FOREIGN PATENT DOCUMENTS

| CN | 201194383 Y | 2/2009 |
| TW | 200633257 | 9/2006 |
| TW | 201401953 A | 1/2014 |

*Primary Examiner* — Kyoung Lee
(74) *Attorney, Agent, or Firm* — CKC & Partners Co., Ltd.

(57) ABSTRACT

A method of fabricating a package module includes placing a pin frame having plural pins on a circuit substrate; bonding the pins to corresponding bonding areas on a circuit substrate, thereby connecting the pins to the bonding areas; cutting off a connecting portion of the pin frame; and bending the pins to be vertical to the circuit substrate. By placing the pins on the corresponding bonding areas on the circuit substrate through the pin frame, and then cutting off the connecting portion of the pin frame and bending the pins, the efficiency of assembling the package module can be greatly promoted.

7 Claims, 10 Drawing Sheets

(51) Int. Cl.
*H01L 25/10* (2006.01)
*H01L 23/495* (2006.01)
*H01L 23/31* (2006.01)

(56) References Cited

U.S. PATENT DOCUMENTS

| | | | | |
|---|---|---|---|---|
| 2002/0008312 A1* | 1/2002 | Sasaki | ............... | H01L 23/49861 |
| | | | | 257/692 |
| 2005/0100293 A1* | 5/2005 | Warashina | ............ | H01L 25/167 |
| | | | | 385/92 |
| 2013/0334672 A1* | 12/2013 | Denta | ................... | H01L 23/495 |
| | | | | 257/666 |

* cited by examiner

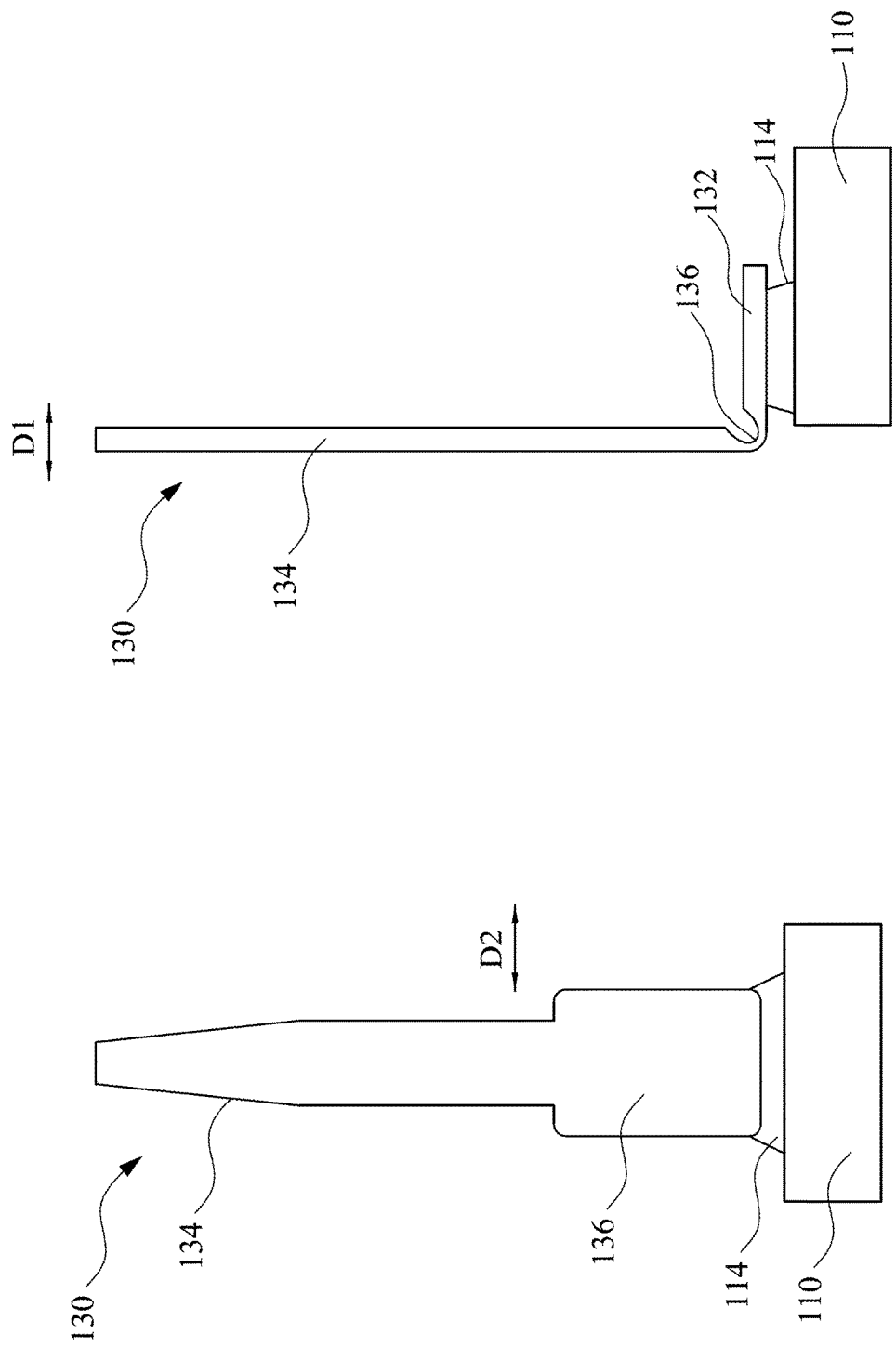

PACKAGE MODULE AND METHOD OF FABRICATING THE SAME

RELATED APPLICATIONS

This application claims priority to China Application Serial Number 201510319405.6, filed Jun. 11, 2015, which is herein incorporated by reference.

BACKGROUND

Field of Invention

The present invention relates to a package module and a method of fabricating the package module. More particularly, the present invention relates to a housing type package module (compared with molding type package module) and its fabrication method.

Description of Related Art

High efficiency, high density and high reliability have been becoming a development trend of the current electronic device for achieving the objects of energy saving, cost reduction and good operation life. For example, an integrated power module (IPM) is designed for integrating plural semiconductor devices which may include power chip and driver chip into a package, so as to provide a possibility of promoting the usage rate of the inner space of the package.

There are many packaging types for power modules, such as metal packaging, ceramic packaging, plastic packaging, etc., in which the plastic packaging has a higher cost/performance ratio, and thus is greatly used in household and industrial application fields.

The plastic packaging also can be further divided into molding type packaging and housing type packaging.

SUMMARY

Hence, the invention provides a method for manufacturing a package module, thereby promoting assembling efficiency of the housing type package module.

An embodiment of the invention provides a method of fabricating a package module. The method includes placing a pin frame having plural pins on a circuit substrate; bonding the pins to bonding areas on the circuit substrate, thereby connecting the pins to the bonding areas; cutting off a connecting portion of the pin frame; and bending the pins to be substantially vertical to the circuit substrate.

Another embodiment of the invention provides a package module fabricated by the aforementioned methods.

Another embodiment of the invention provides a package module. The package module includes a circuit substrate, an outer housing and plural pins. The circuit substrate has bonding areas. The outer housing is mounted to the circuit substrate, and has through holes. The pins are connected to the bonding areas, in which each of the pins includes a soldering portion, a pin body and a bending portion. The soldering portion is connected to one of the bonding areas. The pin body is substantially vertical to the circuit substrate and passes through one of the through holes. The bending portion connects the soldering portion to the pin body, in which the bending portion has a varying cross section.

In the package module of housing type and its fabrication method according to the invention, the efficiency of assembling the package module is greatly promoted by placing the pins on the corresponding bonding areas on the circuit substrate through the pin frame, and then cutting off the connecting portion of the pin frame and bending the pins.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 2A and FIG. 2B are schematic front and side views showing a pin applied to the package module in accordance with an embodiment of the invention;

FIG. 3A to FIG. 5B are schematic local side views showing a bending portion of the pin in the package module before and after being bent in accordance with various embodiments of the invention.

DETAILED DESCRIPTION

Figure 1A:
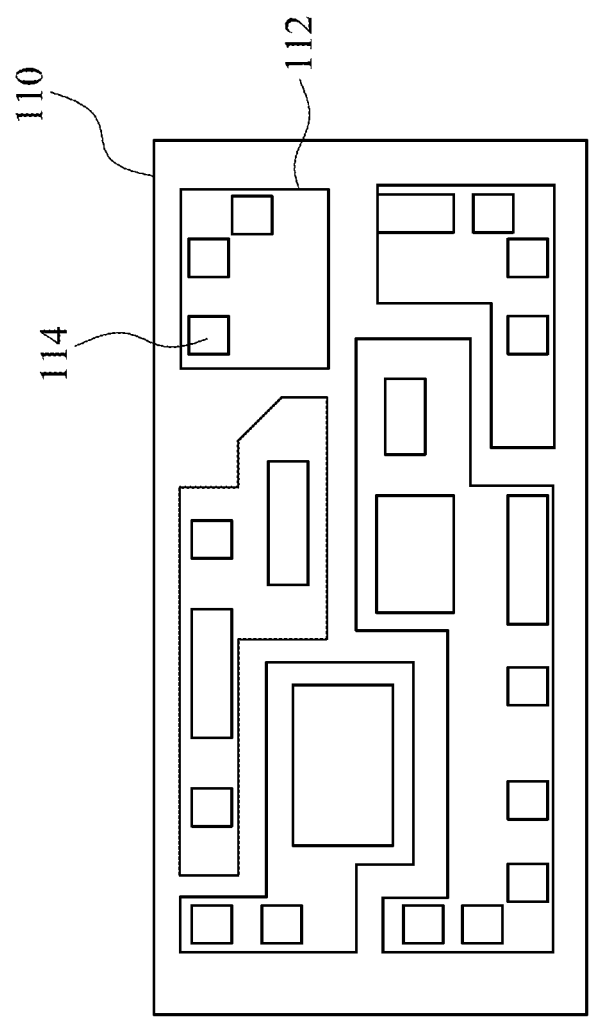
FIG. 1A to FIG. 1F are schematic views of various stages showing a method for fabricating a package method in accordance with an embodiment of the invention.

Reference will now be made in detail to the present embodiments of the invention, examples of which are illustrated in the accompanying drawings. Wherever possible, the same reference numbers are used in the drawings and the description to refer to the same or like parts.

Referring to FIG. 1A to FIG. 1F, the FIG. 1A to FIG. 1F are schematic views of various stages showing a method for fabricating a package method in accordance with an embodiment of the invention. As shown in FIG. 1A, a circuit substrate 110 is provided. The circuit substrate 110 has plural bonding areas 112. The bonding areas 112 may include insulation portions and electrical connection portions. Each of the bonding areas may have several different electrical connection portions which can be connected or not connected to each other, and the invention is not limited thereto. The circuit substrate 110 may be a single-layered or multi-layered printed circuit board (PCB), direct bonding copper (DBC) substrate or lead frame, etc., and the invention is not limited thereto. In the present embodiment, a printed circuit board is used for explanation.

In FIG. 1A, a solder 114, such as a tin solder, is disposed on the bonding areas 112 of the circuit substrate 110, such as the electrical connection portions. The solder 114 can be coated on the bonding areas 112 of the circuit substrate 110 by printing, for example, but the invention is not limited thereto.

Figure 1B:
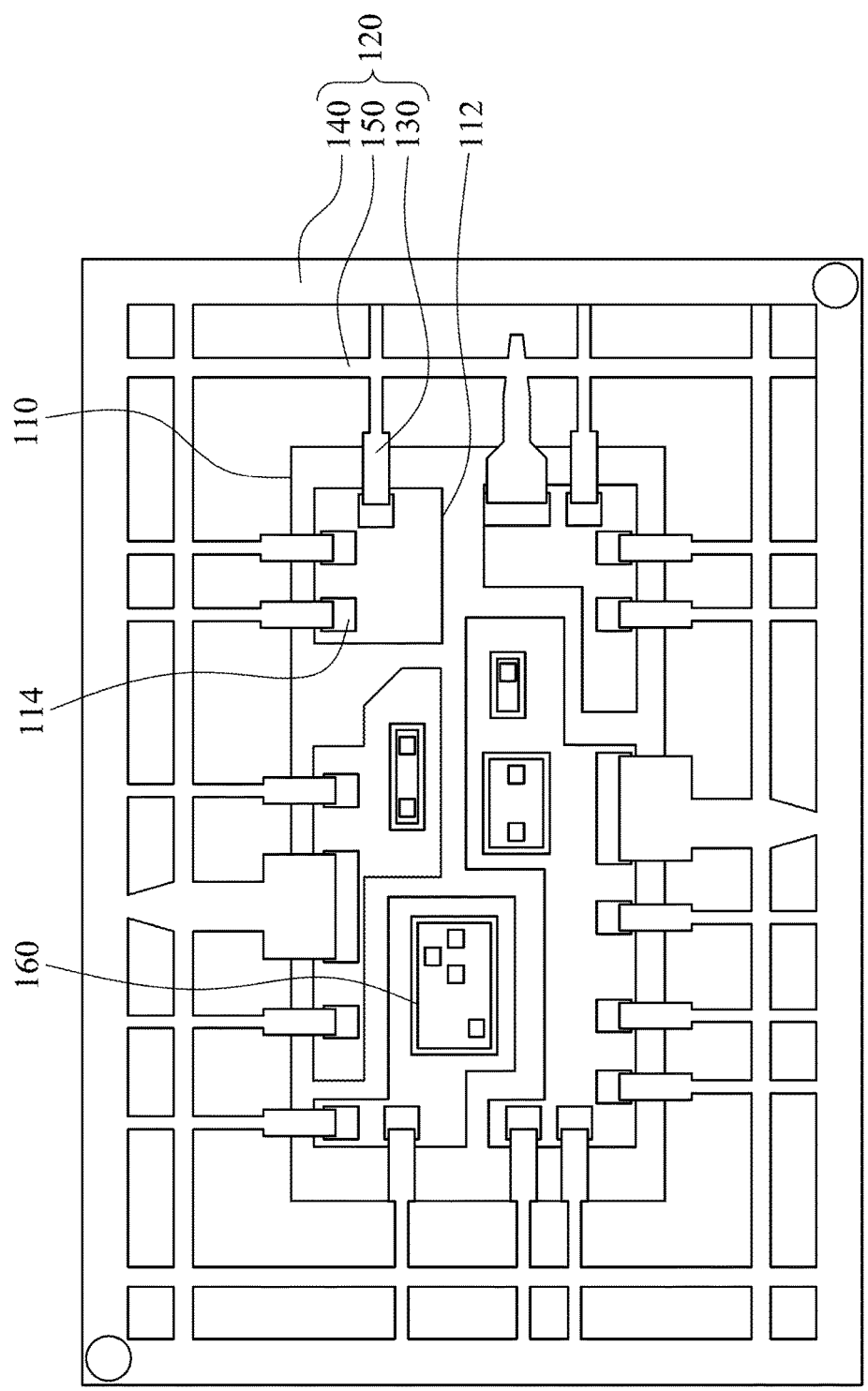

Thereafter, as shown in FIG. 1B, a pin frame 120 is placed on the circuit substrate 110. The pin frame 120 includes plural pins 130, an outer frame 140 and a connection portion 150 connecting the pins 130 to the outer frame 140. The pins 130 are positioned corresponding to at least one portion of the bonding areas 112. In other words, one end of each pin 130 contacts a bonding area 112 of the circuit substrate 110, and the solder 114 can be located between the bonding area 112 and the pin 130, but the invention is not limited thereto. The other end of each pin 130 is connected to the outer frame 140 through the connection portion 150.

Therefore, when the pins 130 are desired to be disposed on the circuit substrate 110, because the pins are monolithically fixed on the outer frame 140 through the connection portion 150, it takes only one operation to place all of the pins 130 on the bonding areas 112. Compared with a conventional procedure which requires placing the pins one by one, the embodiment of the invention can place all of the pins 130 on the predetermined positions on the circuit substrate 110 at one time, thus greatly reducing the time for assembling the pins 130.

As shown in FIG. 1B, electronic elements 160, such as semiconductor chips, are disposed on the circuit substrate 110, and the electronic elements 160 may be partially overlapped in position with the bonding areas 112, thereby enabling the solder 114 to connect the bonding areas 112 to the electronic elements 160. However, the invention is not limited thereto. The pins 130 may be disposed on a surrounding edge of the circuit substrate 110.

The circuit substrate 110, the electronic elements 160 disposed thereon, and the pin frame 120 may be delivered to a heating apparatus, such as a reflow oven, for heating the solder 114 to bond the pins 130 on corresponding parts of bonding areas 112, and to bond the electronic elements 160 on corresponding parts of bonding areas 112, etc. Consequently, the electronic elements 160 and the pins 130 are fixed on the circuit board 110 through the solder 114.

Figure 1C:
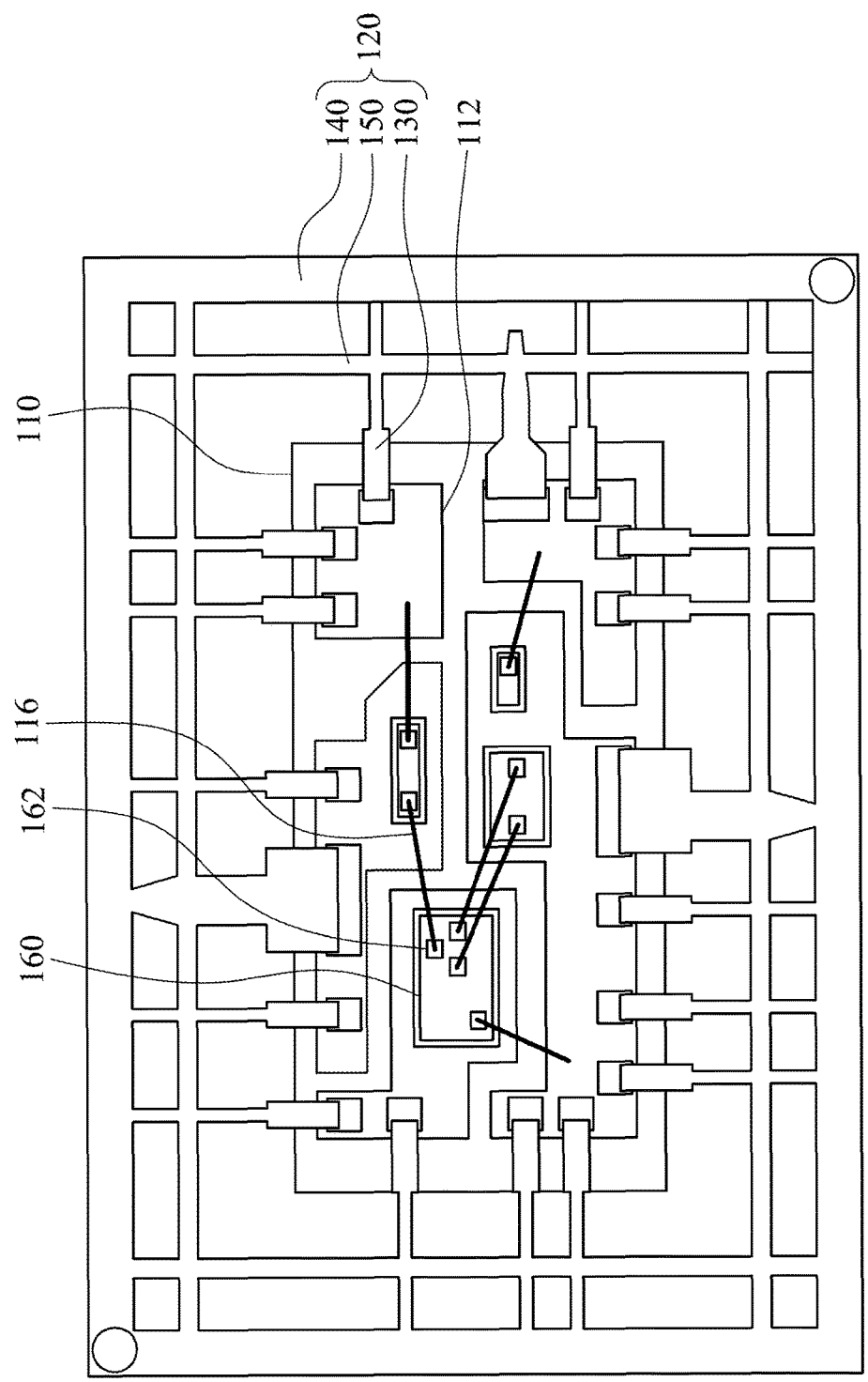

Then, referring to FIG. 1C, there are several contact points 162 on the electronic elements 160. A portion of the contact points 162 of the electronic elements 160 can be connected to the bonding areas 112 of the circuit substrate 110 or to a contact point 162 of another electronic element 160 by using bonding wires 116. Accordingly, the electronic elements 160 can communicate with external devices through the circuit substrate 110 and the pins 130. However, the invention is not limited thereto.

Figure 1D:
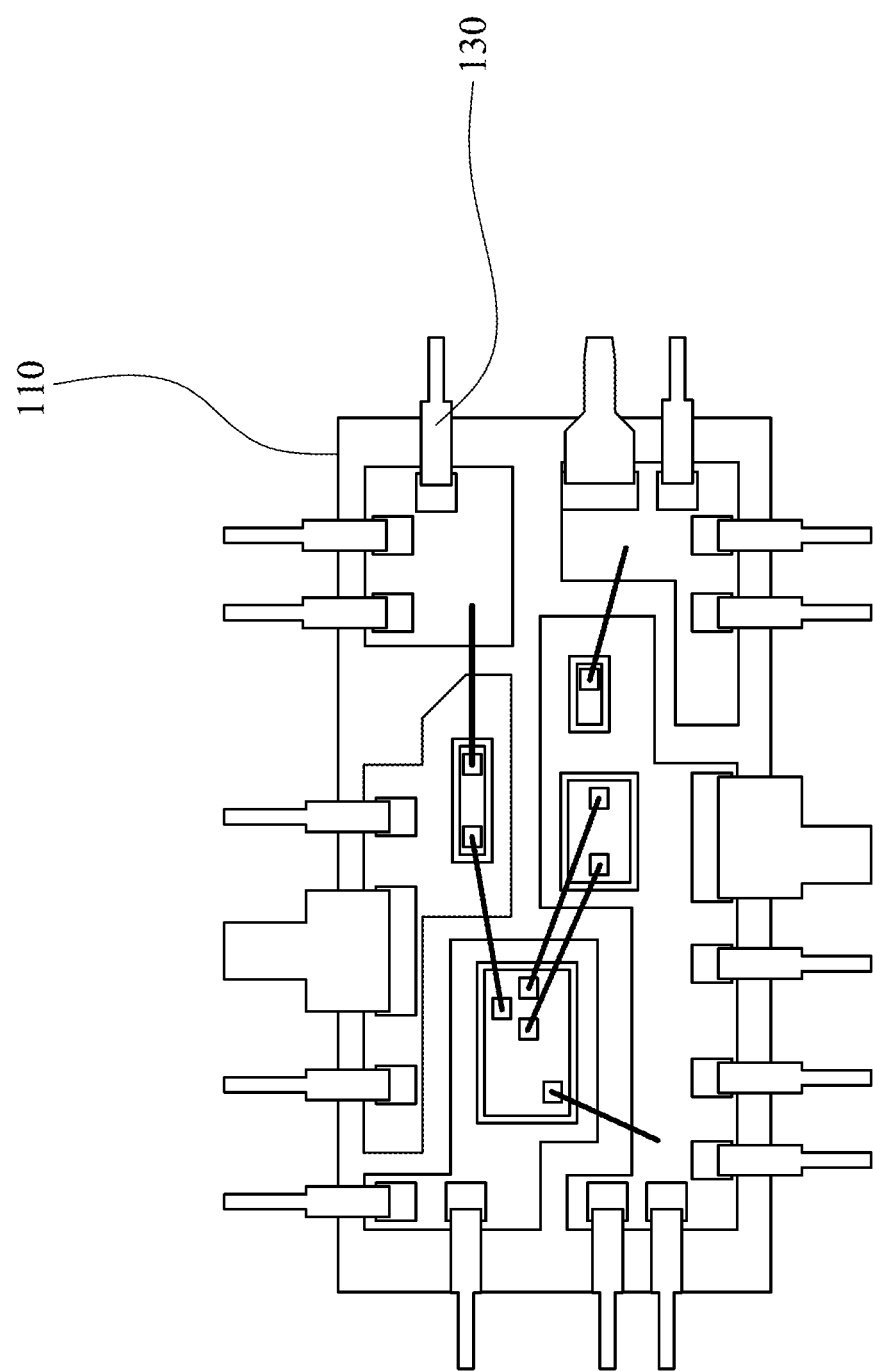

Thereafter, the connection portion 150 of the pin frame 120 is cut off to separate the pins 130 from the outer frame 140 and the connection portion 150 of the pin frame 120, and the pins 130 remain on the circuit substrate 110, as shown in FIG. 1D.

Figure 1E:
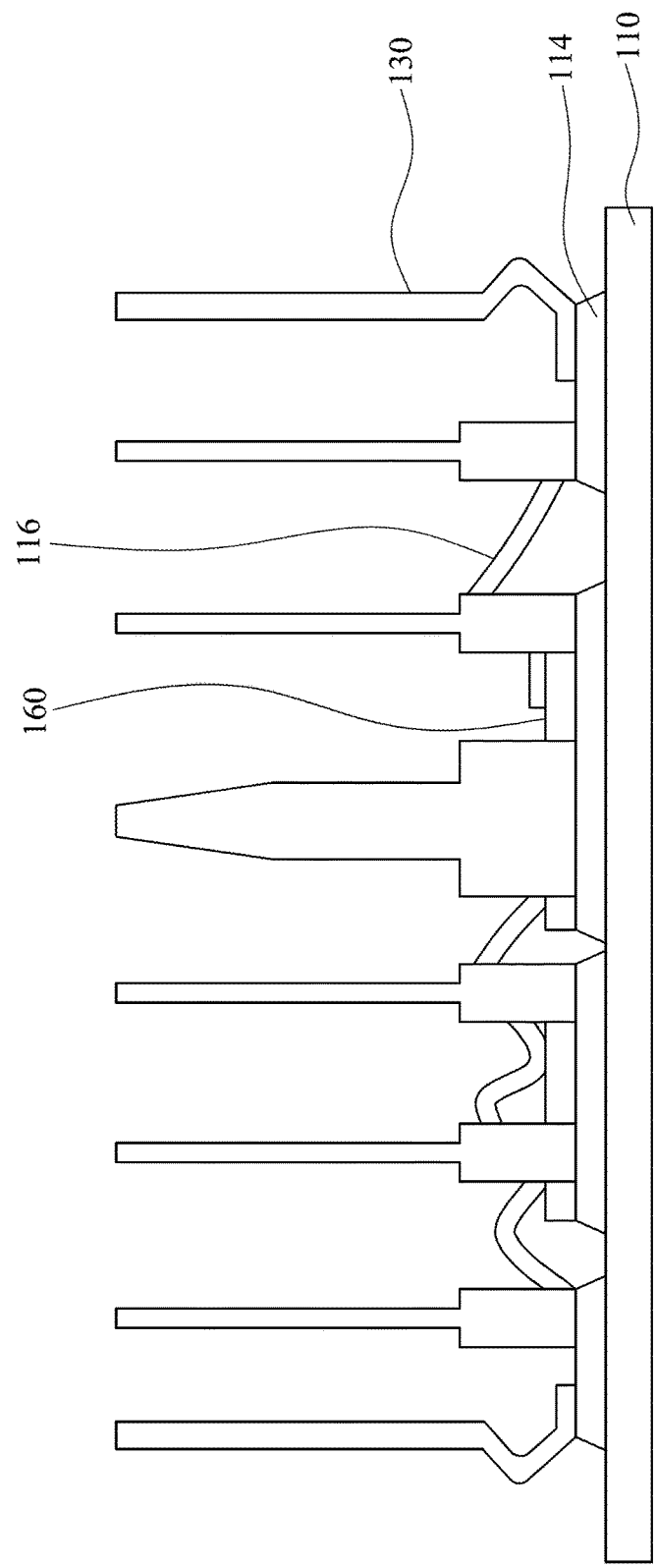

Then, as shown in FIG. 1E, the pin 130 is bent, so as to make one end of the pin 130 about vertical to the circuit substrate 110. For bending the pin 130 conveniently, a treatment can be performed for varying a cross section of the pin 130, which will be explained in subsequent embodiments.

Figure 1F:
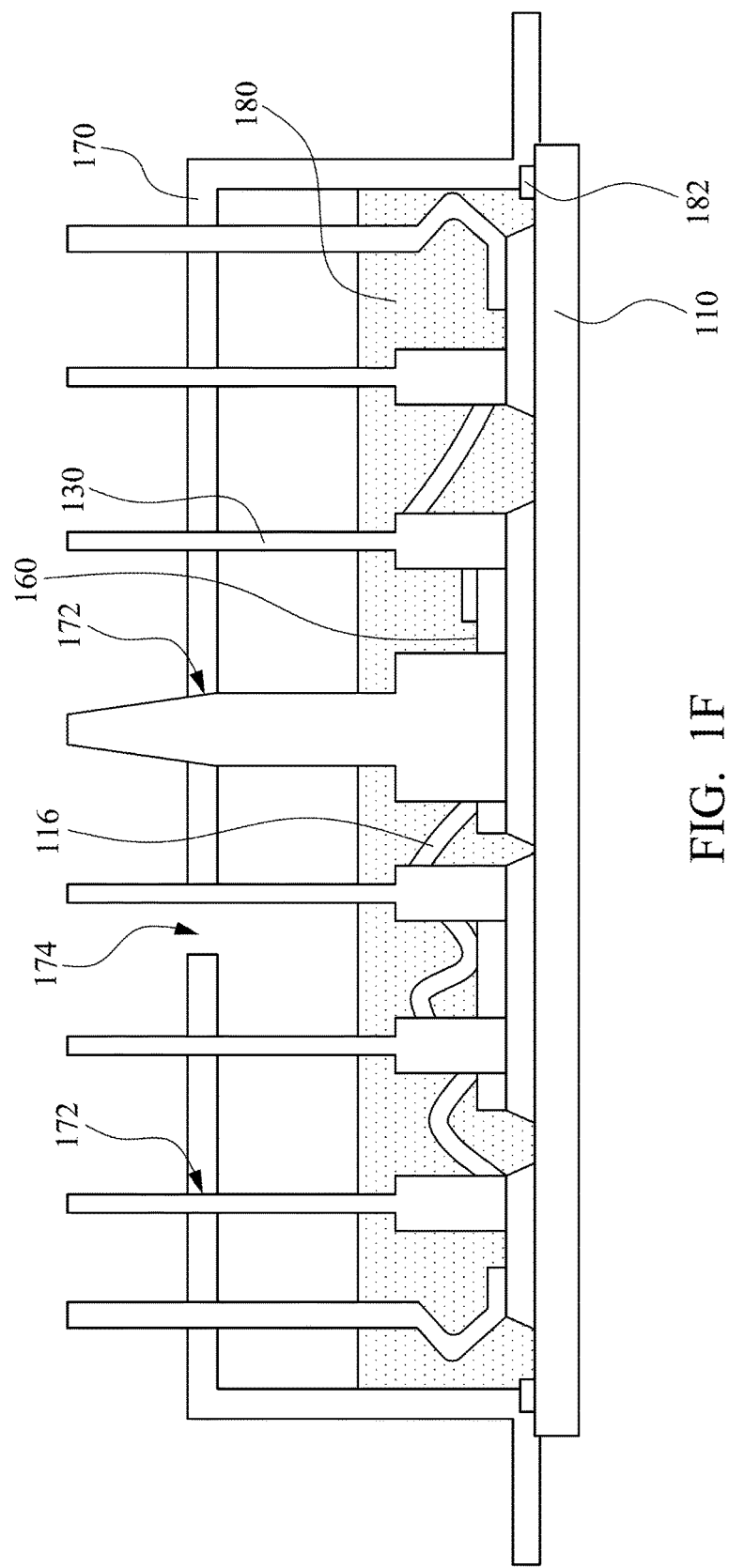

Thereafter, in FIG. 1F, an outer housing 170 is mounted to the electric substrate 110, in which the outer housing 170 may be a plastic housing, but the invention is not limited thereto. The outer housing 170 can be formed by injection molding, for example. There are plural through holes 172 formed on the outer housing 170. The through holes 172 are corresponding in position to the pins 130, such that the pins 130 may pass through the through holes 172 to be exposed from the outer housing 170.

In FIG. 1F, a protective glue 180 fills the outer housing 170 to cover the circuit substrate 110, the electronic elements 160 and a portion of the pins 130. The protective glue 180 may be injected into the outer housing 170 through a filling hole 174 disposed on the outer housing 170, but the invention is not limited thereto. Besides for protecting the electronic elements 160 and the bonding wires 116 disposed thereon, the protective glue 180 also can be used for electrically isolating the adjacent pins 130. For example, the material of the protective glue 180 may be flowable glue, such as silicone gel.

The operation of mounting the housing 170 to the circuit substrate 110 further includes applying sealing glue 182 to a gap between the outer housing 170 and the circuit substrate 110, in which the sealing glue 182 is used to connect the outer housing 170 to the circuit substrate 110 and to isolate the ambient moisture.

In sum, in an embodiment of the invention, the fabrication method of the package module uses the pin frame to dispose all of the pins on the corresponding bonding areas of the circuit substrate, and cuts off the connection portion of the pin frame after the pins are fixed on the bonding areas, and then bends the pins.

Referring to FIG. 2A and FIG. 2B, the FIG. 2A and FIG. 2B are schematic front and side views showing a pin applied to the package module in accordance with an embodiment of the invention. The pin 130 includes a soldering portion 132, a pin body 134 and a bending portion 136. The soldering portion 132 may be parallel to the circuit substrate 110, and is soldered on the bonding areas of the circuit substrate 110 through the solder 114. The pin body 134 is vertical to the circuit substrate 110, and is configured to pass through the through hole 172 of the outer housing 170. The bending portion 136 connects the pin body 134 to the soldering portion 132.

As described above, for easily bending the pin 130, a cross-section varying treatment may be performed to vary the cross section of the bending portion 136, thereby enabling a portion of the bending portion 136 to be bent easily. For example, the cross-section varying treatment includes, but not limited to, grooving, drilling or shrinking the bending portion 136 of the pin 130 along its thickness direction D1 or width direction D2, thereby reducing the width or thickness of the bending portion 136 locally (for example, relative to the soldering portion 132), and thus the pin 130 can be bent relatively easily.

Figure 2C:
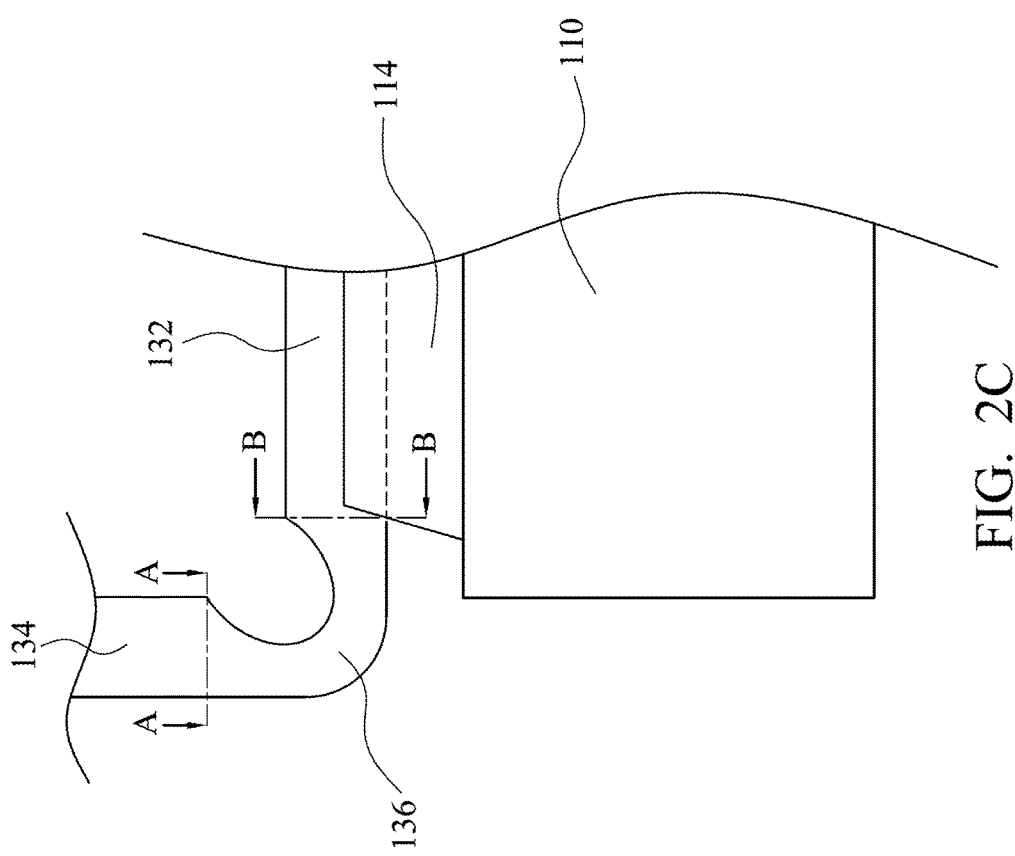
FIG. 2C is a locally enlarged view of the pin shown in FIG. 2B.

Referring to FIG. 2A to FIG. 2C, the FIG. 2C is a locally enlarged view of the pin 130 shown in FIG. 2B. Specifically speaking, the pin body 134 can be vertical to the circuit substrate 110, and the soldering portion 132 can be parallel to the circuit substrate 110. The bending portion 136 may be a bent portion between a plane A-A and a plane B-B, but the invention is not limited thereto.

The aforementioned cross-section varying treatment includes enabling at least one portion of the bending portion 136 to have a varying cross section. For example, the bending portion 136 has an area of which the cross section is smaller than that of the plane A-A or the plane B-B. The design of varying the cross section of the bending portion 136 can be made together with the fabrication the pin frame 120 (referring to FIG. 1). For example, etching or mechanical processing can be performed for grooving, drilling or shrinking the bending portion 136 of the pin 130 along its thickness direction D1 or width direction D2, so as to reduce the cross-sectional area of the bending portion 136 locally. However, the invention is not limited thereto, as long as the bending portion 136 includes a varying cross section.

Figures 3A, 4A, 5A:
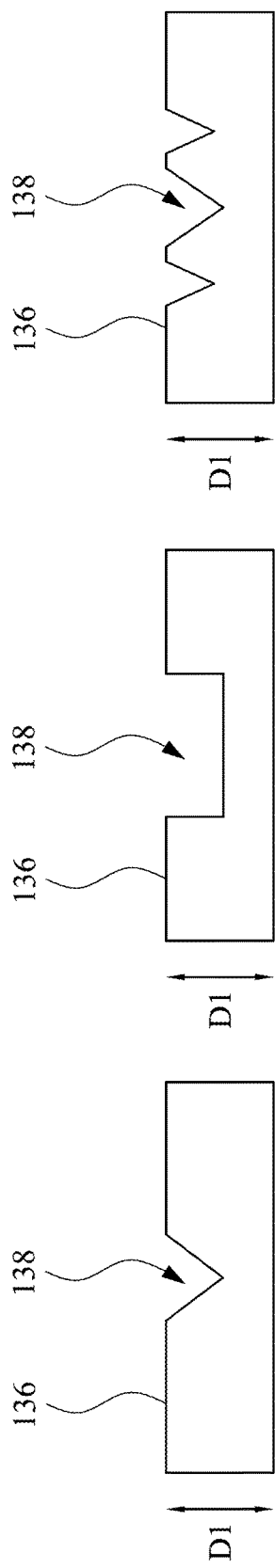
Figures 3B, 4B, 5B:
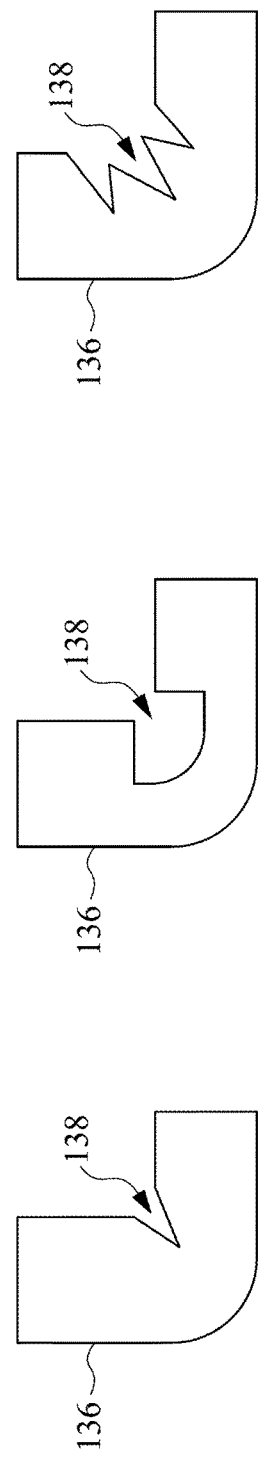

Thereafter, referring to FIG. 3A to FIG. 5B, the FIG. 3A to FIG. 5B are schematic local side views showing a bending portion of the pin in the package module before and after being bent in accordance with various embodiments of the invention. FIG. 3A, FIG. 4A and FIG. 5A are side views showing the bending portion 136 before being bent, and FIG. 3B, FIG. 4B and FIG. 5B are side views showing the bending portion 136 after being bent. Specifically speaking, as shown in FIG. 3A to FIG. 5B, the cross section of the bending portion 136 varies along the thickness direction D1. The bending portion 136 has at least one recess portion 138.

The recess portion 138 may be located at an inner side or an outer side of the bending portion 136, and the depth of the recess portion 138 is perferably not greater than one half of the thickness of the bending portion 136 for maintaining sufficient mechanical strength. However, the invention is not limited thereto.

The recess portion 138 can be a triangular groove as shown in FIG. 3A, a rectangular groove as shown in FIG. 4A, a zigzag groove as shown in FIG. 5A. With the disposition of the recess portion 138, the stress generated when the bending portion 136 is being bent can be reduced, and thus the bending portion 136 can be bent relatively easily.

Figure 6A:
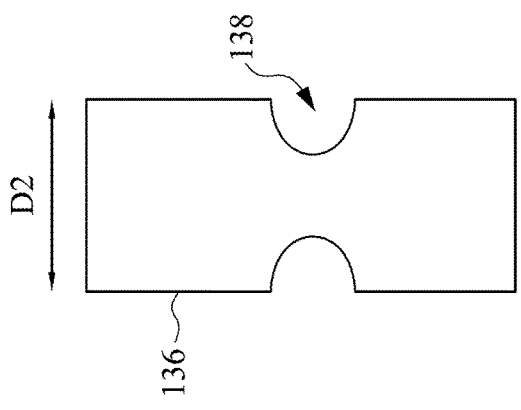
FIG. 6A to FIG. 7B are schematic local front views showing a bending portion of the pin in the package module before and after being bent in accordance with various embodiments of the invention.
Figure 6B:
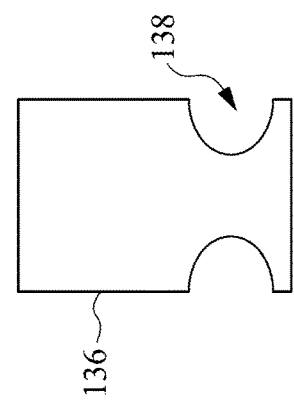
Figure 7A:
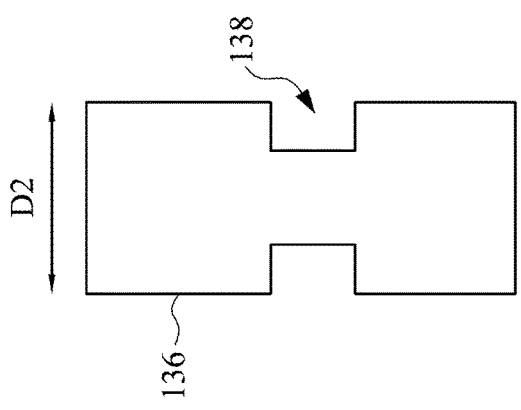
Figure 7B:
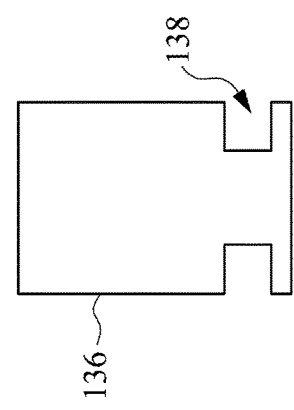

Referring to FIG. 6A to FIG. 7B, the FIG. 6A to FIG. 7B are schematic local front views showing a bending portion of the pin in the package module before and after being bent in accordance with various embodiments of the invention. FIG. 6A and FIG. 7A are front views showing the bending portion 136 before being bent, and FIG. 6B and FIG. 7B are front views showing the bending portion 136 after being bent. Specifically speaking, as shown in FIG. 6A to FIG. 7B, the cross section of the bending portion 136 varies along the width direction D2. The bending portion 136 has at least one recess portion 138. The recess portion 138 may be located at both left and right sides of the bending portion 136, and the width of the recess portion 138 is perferably not greater than one half of the width of the bending portion 136 for maintaining sufficient mechanical strength. However, the invention is not limited thereto.

The recess portion 138 can be a rectangular groove as shown in FIG. 6A, an arc groove as shown in FIG. 7A, or in other embodiments, the recess portion 138 can be a regular-shaped or irregular-shaped groove.

In some embodiments, the cross-sectional change of the bending portion 136 is not limited to only along the thickness direction D1 or along the width direction D2, and can be simultaneously along both of the thickness direction D1 and the width direction D2. Those who are skilled in the art may change the position, number and shape of the recess portion 138 of the bending portion 136, and the changes are not limited to the aforementioned embodiments. The design of varying the cross section may be made by forming through holes or shrinking the width, and the invention is not limited thereto.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of fabricating a package module, the method comprising:

placing a pin frame having a plurality of pins on a circuit substrate;

bonding the pins to a plurality of bonding areas on the circuit substrate, thereby connecting the pins to the bonding areas;

cutting off a connecting portion of the pin frame;

varying a cross section of a bending portion of each of the pins, wherein the bending portion has at least one recess portion, the recess portion is located at an inner side of the bending portion, and the recess portion is a triangular groove or a zigzag groove, wherein a depth of the recess portion is not greater than one half of a thickness of the bending portion;

bending the pins to be substantially vertical to the circuit substrate;

mounting an outer housing to the circuit substrate, wherein the outer housing has a plurality of through holes; and penetrating the pins through the through holes, wherein a pin body of each of the pins is protruded from the outer housing, and a bending portion of each of the pins is covered by the outer housing.

2. The method of claim 1, further comprising:

filling in the outer housing with a glue, thereby covering the circuit substrate and the bending portion of each of the pins with the glue.

3. The method of claim 1, further comprising:

placing a solder on the bonding areas of the circuit substrate; and heating the solder.

4. The method of claim 1, further comprising:

disposing a plurality of electronic elements on the circuit substrate; and connecting at least one contact point of the electronic elements to at least one portion of the bonding areas by wire bonding.

5. A package module fabricated by a method of claim 1.

6. A package module, comprising:

a circuit substrate having a plurality of bonding areas;

an outer housing mounted to the circuit substrate, the outer housing having a plurality of through holes;

a plurality of pins connected to the bonding areas, wherein each of the pins comprises:

a soldering portion connected to one of the bonding areas;

a pin body which is substantially vertical to the circuit substrate and passes through one of the through holes; and a bending portion connecting the soldering portion to the pin body, wherein the bending portion is covered by the outer housing and has at least one recess portion, the recess portion is located at an inner side of the bending portion, and the recess portion is a triangular groove or a zigzag groove, wherein a depth of the recess portion is not greater than one half of a thickness of the bending portion.

7. The package module of claim 6, wherein the bending portion has a shrunk thickness along its thickness direction relative to the soldering portion.

* * * * *